(12) United States Patent
Cheng

(10) Patent No.: US 10,947,617 B2
(45) Date of Patent: Mar. 16, 2021

(54) TUNE ABLE MASKS FOR PVD DEPOSIT THICKNESS UNIFORMITY MANAGEMENT

(71) Applicant: Shiping Cheng, San Jose, CA (US)

(72) Inventor: Shiping Cheng, San Jose, CA (US)

( * ) Notice: Subject to any disclaimer, the term of this patent is extended or adjusted under 35 U.S.C. 154(b) by 0 days.

(21) Appl. No.: 15/829,928

(22) Filed: Dec. 3, 2017

(65) Prior Publication Data

US 2019/0169732 A1   Jun. 6, 2019

(51) Int. Cl.
  *C23C 14/04*   (2006.01)
(52) U.S. Cl.
  CPC .................................. *C23C 14/042* (2013.01)
(58) Field of Classification Search
  CPC .... C23C 14/04–044; C23C 16/04–042; C23C 18/06
  USPC .......................................................... 118/720
  See application file for complete search history.

(56) References Cited

U.S. PATENT DOCUMENTS

| | | | | |
|---|---|---|---|---|
| 3,904,503 A * | 9/1975 | Hanfmann | ............ | C23C 14/044 118/50.1 |
| 4,102,768 A * | 7/1978 | Kearin | ................... | C03C 17/245 204/192.13 |
| 4,329,091 A * | 5/1982 | Erkfritz | ................. | B23C 5/2441 407/108 |
| 6,375,747 B1 * | 4/2002 | Beinat | .................... | C23C 14/044 118/720 |
| 6,447,653 B1 * | 9/2002 | Debley | .................. | C23C 14/044 204/192.11 |
| 8,048,227 B2 | 11/2011 | Tso et al. | | |
| 8,308,921 B1 * | 11/2012 | Hiner | .................... | C23C 14/042 204/298.11 |
| 2002/0139666 A1 * | 10/2002 | Hsueh | ................... | C23C 14/044 204/298.03 |
| 2003/0129325 A1 * | 7/2003 | Kandaka | ............... | C23C 14/044 427/596 |
| 2004/0163592 A1 * | 8/2004 | Abiko | ................... | C23C 14/042 118/715 |
| 2006/0057240 A1 * | 3/2006 | Koinuma | .............. | C23C 14/044 425/223 |
| 2007/0190889 A1 * | 8/2007 | Lee | ........................ | C23C 14/042 445/47 |
| 2009/0090301 A1 * | 4/2009 | Tso | ......................... | C23C 14/50 118/715 |
| 2011/0148037 A1 * | 6/2011 | Crossman | ........... | G07F 17/3202 273/143 R |
| 2013/0263782 A1 * | 10/2013 | Wang | .................. | C23C 16/4585 118/720 |

* cited by examiner

*Primary Examiner* — Charlee J. C. Bennett
(74) *Attorney, Agent, or Firm* — Jingfeng Song; SciNova IP and Regulatory Consulting LLC

(57) ABSTRACT

The tunable mask in the current invention comprises three parts: a mask body, an upper piece, and a lower piece. When these parts are assembled together, either or both of the upper and lower pieces' positions on the mask body can be adjusted to form various shapes of the tunable mask. Different shapes of upper and lower pieces are also available for use. During the coating process in a physical vapor deposition (PVD) system, a single or multiple tunable masks are positioned between the substrate and the evaporation source. Uniformity of the coating thickness on the substrate is improved when the tunable mask provides an optimal shielding effect with a selective shape.

9 Claims, 11 Drawing Sheets

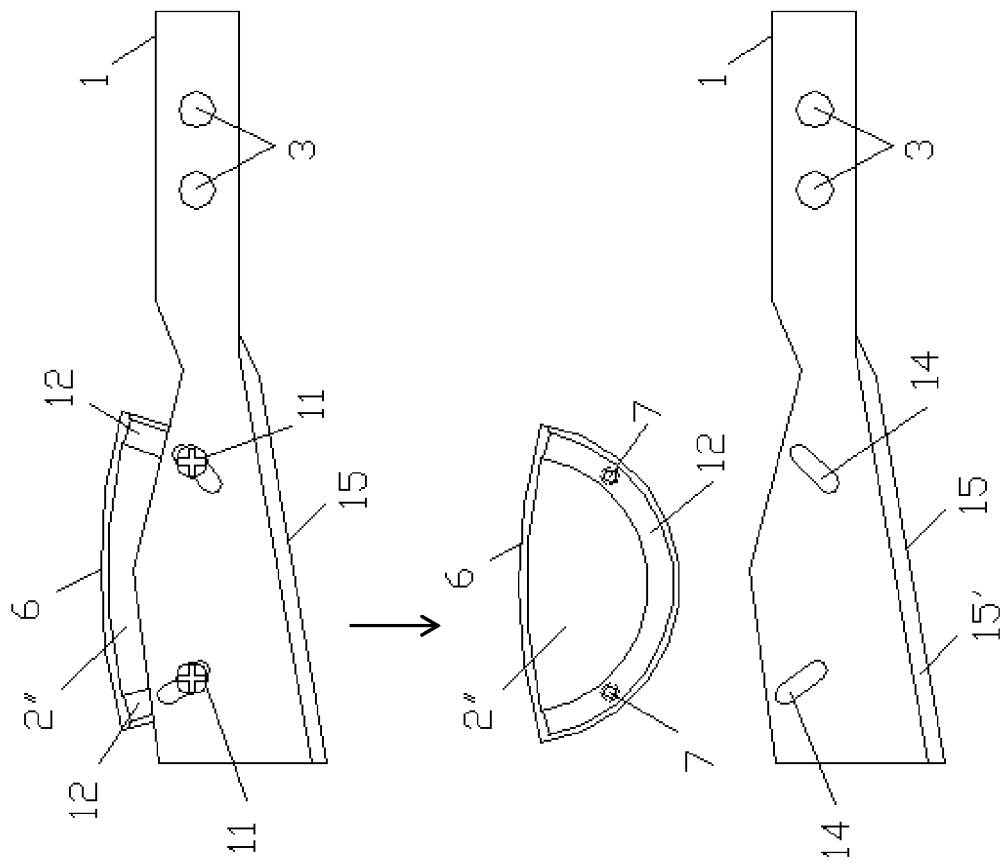
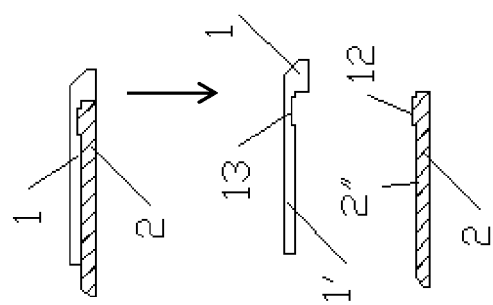

TUNE ABLE MASKS FOR PVD DEPOSIT THICKNESS UNIFORMITY MANAGEMENT

BACKGROUND OF THE INVENTION

Physical vapor deposition (PVD) plays an important role in today's coating process of mass production. PVD is characterized by a process in which the coating material goes from a condensed phase to a vapor phase in an environment with a high vacuum and high temperature and then back to a thin film condensed on a substrate, the product or material that needs to be coated. Compared to the traditional coating methods such as the electroplating process, PVD coatings are more corrosion resistant and durable. In addition, it could be applied to a more diverse group of substrates and surfaces.

However, maintaining uniformity of the coating thickness has been a challenge during the PVD process. The method used by the industry for managing the coating thickness is to insert one or multiple shielding masks between the substrate and the evaporation source of the coating material. The placement of the shielding mask in the PVD coating chamber helps the evaporated coating material to distribute and deposit more evenly on the surface of the substrate. The effect of the shielding mask on the coating uniformity greatly relates to the shape of the shielding mask. In order to identify the shielding mask's shape that helps achieve the best result of uniformity, a pilot study must be conducted before proceeding to the mass production. In the case of a long time production process for high end products, the shape of the shielding mask needs to be periodically adjusted and calibrated. However, the shielding mask is usually made by hand before the test run. In order to find the best one that fits the process a large amount of shielding masks with different shapes must be prepared. The preparation and test of the conventional shielding mask is time-consuming. Making fine adjustment on the shape of the shielding mask is very inconvenient if not impossible. This could lead to missing the best shape for a good uniformity result. In addition, the reproducibility of test results is low due to the lack of consistency and repeatability of the manually prepared shielding mask.

Therefore, it is very much needed to have a shielding mask that can be quickly set up in the coating process and whose shape can be easily adjusted or tuned without the remaking of the mask. It is also very important that this shielding mask's adjustable shape can be easily recorded and repeatedly used again. This would provide a great help for reproducing the uniformity result on the coating thickness.

SUMMARY OF THE INVENTION

A tunable mask in the current invention comprises a mask body, an upper piece, and a lower piece. Unlike the conventional shielding mask used in the PVD coating process, this tunable mask is pre-made and able to be quickly set up during the coating process. The shape of the tunable mask is adjustable and can be accurately recorded and easily repeated.

In this invention, the positions and the pointing direction of the upper piece, the lower piece, or both can be changed on the mask body. Both the upper and lower pieces are pre-shaped. When these parts are assembled together to form a tunable mask, different shapes of the mask can be created by adjusting the pointing direction of the tunable parts or changing their shapes. A tunable mask with an ideal shielding effect between the substrate and the evaporation source can be identified by changing its shape in the coating uniformity test.

In some embodiments of the invention, the tunable mask comprises a mask body, a lower piece, a tunable upper piece, and scale tick marks. In some particular embodiments, the tunable mask comprises a mask body with at least one kidney shaped hole, a lower piece with a blade and no more than two threaded holes, an upper piece with a blade and at least one threaded hole, and scale tick marks. The upper piece is affixed to the mask body by fixing screws. In some other particular embodiments, the upper and lower pieces of the tunable mask have blades with a straight line, a convex curve, or a concave curve. In some more particular embodiments, the tunable mask comprises a mask body, a tunable upper piece, scale tick marks, and a lower piece that is an integral part of the mask body. In other more particular embodiments, the tunable mask comprises a mask body, a tunable upper piece, scale tick marks, and a lower piece that is affixed to the mask body and comes with various shapes for replacement. In some other more particular embodiments, the tunable mask comprises a mask body having dual sets of scale tick marks, a tunable upper piece, and a tunable lower piece.

As part of the current invention, using the tunable mask as described above to form a shield between the substrate and the evaporation sauce helps manage the coating thickness in the PVD process. Depending on the type of the substrate and the PVD conditions, a single or multiple tunable masks may be used to achieve the best outcome for uniformity of the coating thickness.

BRIEF DESCRIPTION OF THE DRAWINGS

FIG. 1(b) shows the underside of the small tunable mask with an arc rail.

FIG. 1(c) shows the cross-sectional view of the mask body and the upper piece when they are put together in the small tunable mask.

DETAILED DESCRIPTION OF THE PREFERRED EMBODIMENTS

A tunable mask comprises three parts: a mask body, an upper piece, and a lower piece. The mask body is used to hold the upper and lower pieces. Preferably all parts are made of stainless steel. However, other metals, alloy, or plastic materials that are able to endure high temperature can also be used to prepare the tunable mask.

The upper piece is affixed to the mask body by fixing screws. The lower piece either is an integral part of the mask body or is a separated part from the mask body before they are put together. Both the upper piece and the lower piece have one blade. When all parts are assembled together to form the tunable mask, these two blades face opposite directions. The pointing direction and the position of the upper piece on the mask body are adjustable. The pointing direction means the direction to which the blade generally faces. The curve shape of the blades on both the upper and lower pieces may be varied. For those round or polynomial curves various radius of curvature is applied to form their shapes. By either adjusting the positions and point directions of tunable parts or changing their shapes the tunable mask may form various two-dimensional shapes. Several preferred embodiments are shown in the figures and described below in detail.

Figure 1A:
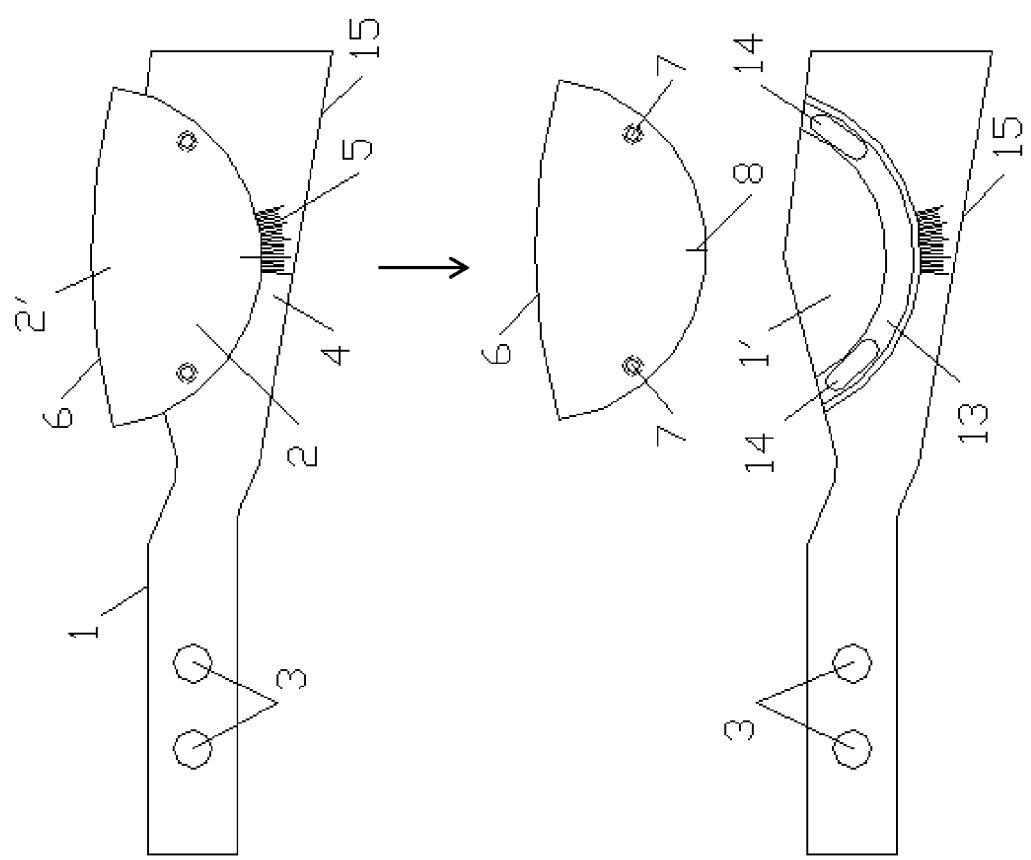
FIG. 1(a) shows the topside of the small tunable mask with an arc rail.

Example 1 is a small tunable mask and shown in FIG. 1(a). The topside of the mask before and after the assembly is seen in this figure. The mask body 1 and the lower piece 4 are made into one piece in this example. The lower piece 4 has a blade 15. The two mounting holes 3 on the mask body 1 are used to attach the tunable mask to a PVD system. Scale tick marks 5 are put on the surface of the lower piece 4. There is an arc rail 13 notched on the topside 1' of the mask body 1. Two kidney-shaped holes 14 are formed within the area of the arc rail 13. The upper piece 2 has a shape of half disk with a convex blade 6. Two threaded holes 7 are opened on the upper piece 2. A tick mark 8, which is used to align the scale tick mark 4 when adjusting the position and the pointing direction of the upper piece 2 on the mask body 1, is inscribed or printed on the topside 2' of the upper piece 2. When pointing the tick mark 8 to the same number of scale, the position and the pointing direction of the upper piece 2 remain the same.

The underside of this small tunable mask before and after assembly is shown in FIG. 1(b). Two fixing screws 11 are passed through the kidney-shaped holes 14 and tightened into the threaded holes 7 in the upper piece 2. The upper piece 2 is affixed to the mask body 1 by these two fixing screws 11. It can be seen that part of upper piece 2 is not covered by the mask body 1. The blade 6 of the upper piece 2 is able to be tuned and face different directions before being affixed to mask body 1. When the blade direction is changed, the area of the upper piece 2 that is not covered by the mask body 1 is changed, so is the shape of the tunable mask. The blade 6 of the upper piece 2 and the blade 15 of the lower piece 4 are single-edged. Both blade edges 6' and 15' are at the bottom side of the small tunable mask. An arc ridge 12 is made at the underside 2" of the upper piece 2. The shape and size of the arc ridge 12 match exactly to the hollow space of the arc rail 13 formed on the topside 1' of the mask body 1. The cross-sectional views of the mask body 1 and upper piece 2 before and after they are assembled are showed in FIG. 1(c). It can be seen that both pieces are perfectly mosaicked together by fitting the arc ridge 12 into the arc rail 13. Once put together, the upper piece 2 can be turned and moved along the track formed by the arc ridge 12 and the arc rail 13 as long as the fixing screws 11 can be passed through the kidney-shaped holes 14 and tightened into the threaded holes 7 to affix the upper pieces 2 on the mask body 1.

Figure 2:
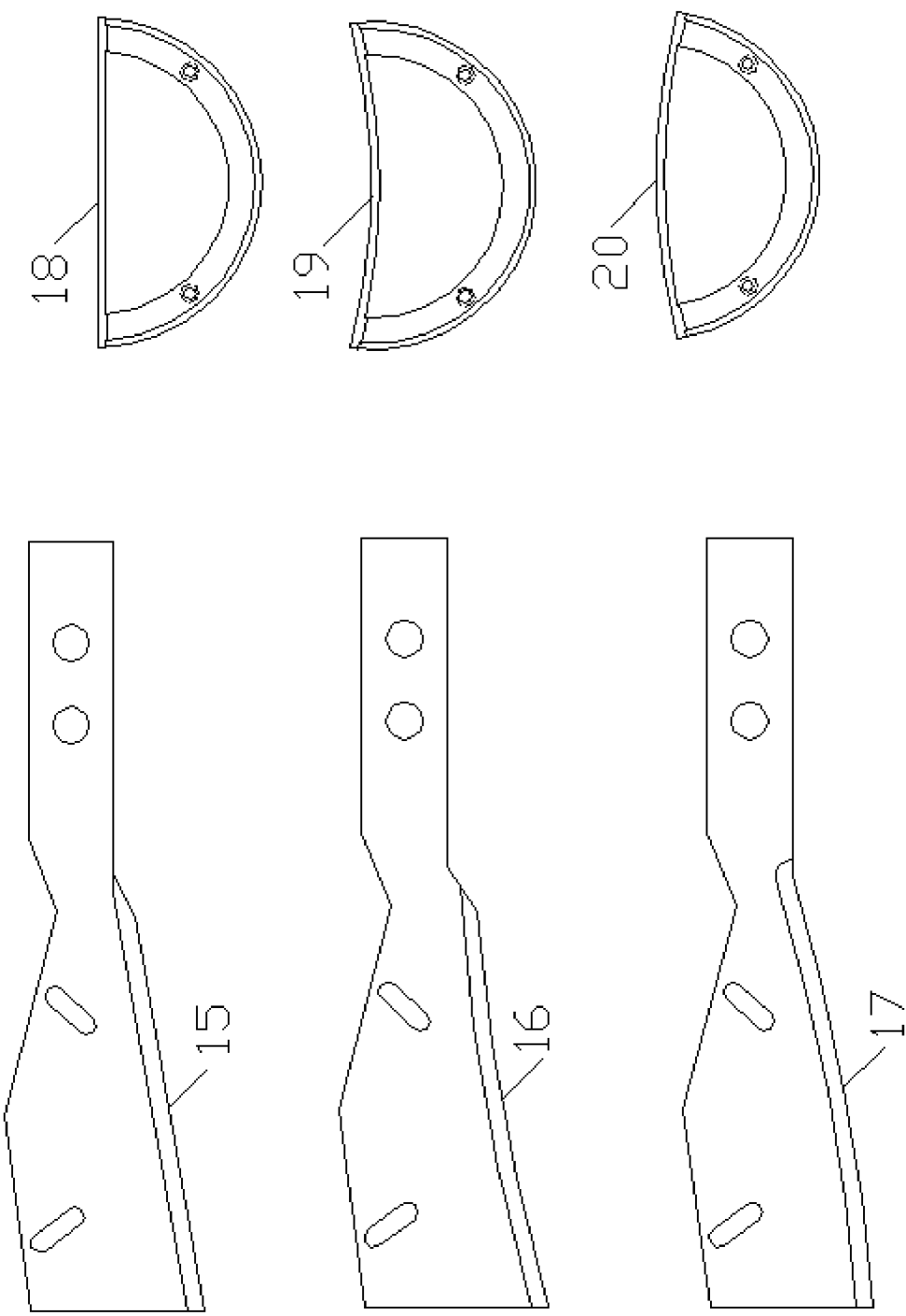
FIG. 2 shows various shapes of the blade curves for the small tunable mask.

As shown in FIG. 2, the blade curve of the lower piece has various shapes. Besides the blade 15 with a straight line, there are also other types of curves such as the concave curve in the blade 16 and the convex curve in the blade 17. Similarly the blade curve of the upper piece can also be made into different shapes. A group of straight 18, concave 19, and convex 20 blades on the upper piece is shown next to the upper pieces. In other preferred embodiments, the blade shape of either the upper or lower piece may not look exactly the same as those shown in FIG. 4. It may be different from the typical shapes described above depending on the coating need.

Figure 3A:
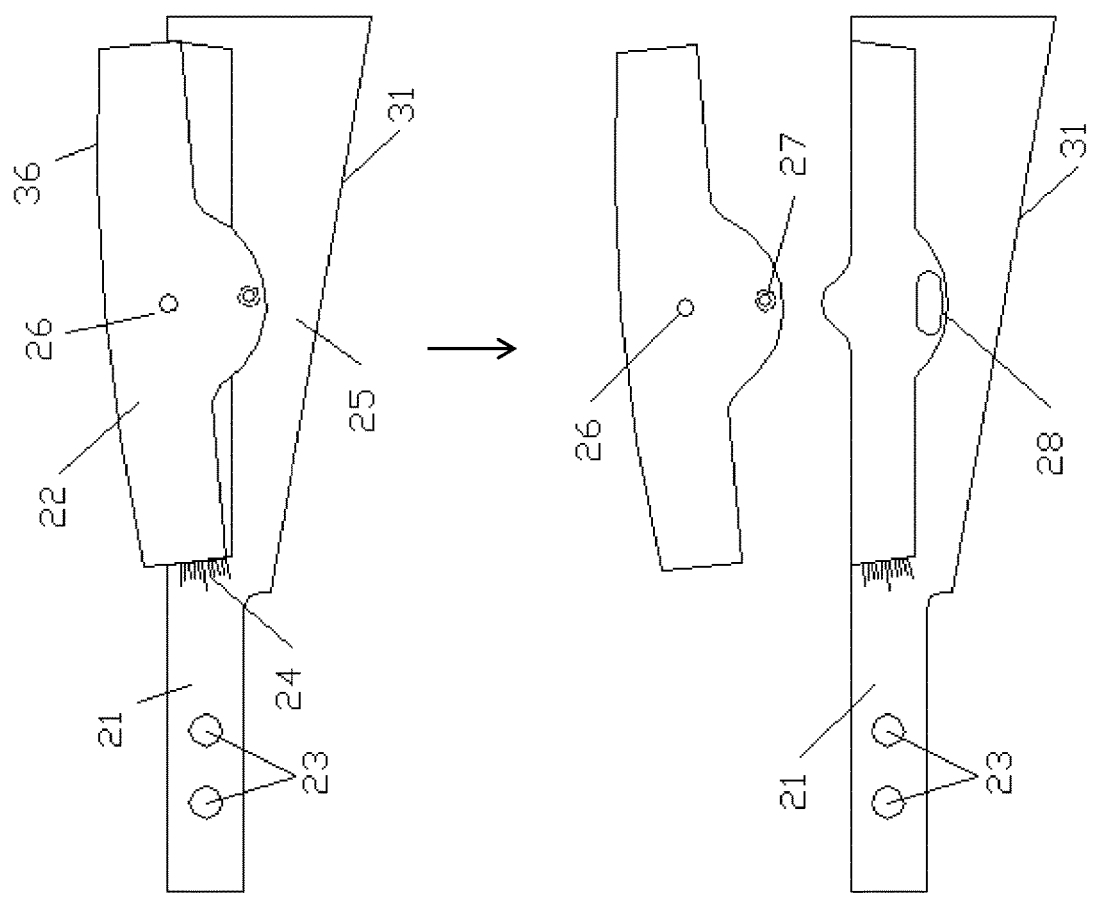
FIG. 3(a) shows the topside of the big tunable mask.
Figure 3B:
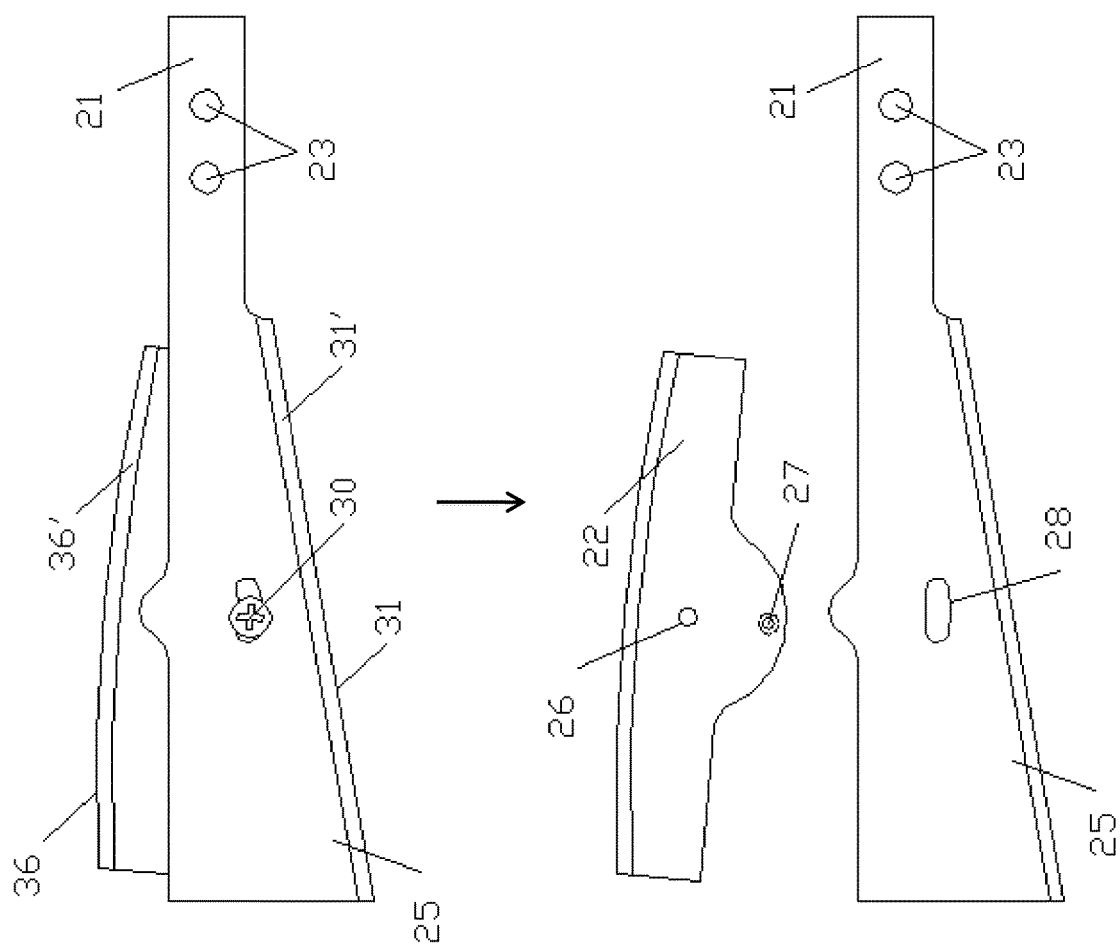
FIG. 3(b) shows the underside of the big tunable mask.

Another preferred embodiment of the tunable mask is shown in FIGS. 3(a) & (b). Example 2 is called the big tunable mask because the upper piece 22 is wider than the one in the small tunable mask and is able to shield more area of the substrate. Being the same as Example 1, the mask body 21 and the lower piece 25 of Example 2 are made into one piece. The mask body 21 has one kidney shaped hole 28. Each of the lower piece (25) and the upper piece (22) has one blade (31 and 36). However, the mask body has a pin 29, which is used to hold the upper piece 22 through the pin hole 26. The upper piece 22 has only one threaded hole 27. Scale tick marks 24 are put on the mask body 21 and used for the adjustment of the upper piece 22. When it is used, this big tunable mask is installed to the PVD system by the mounting holes 23. At the underside of this big tunable mask, as shown in FIG. 3(b), the upper piece 22 is affixed to the mask body 21 by the fixing screw 30, which is tightened through the kidney shaped hole 28 into the threaded hole 27. After the tunable mask is assembled, the blade edges (31' and 36') of both the upper (22) and lower (25) pieces face same direction.

Figure 4:
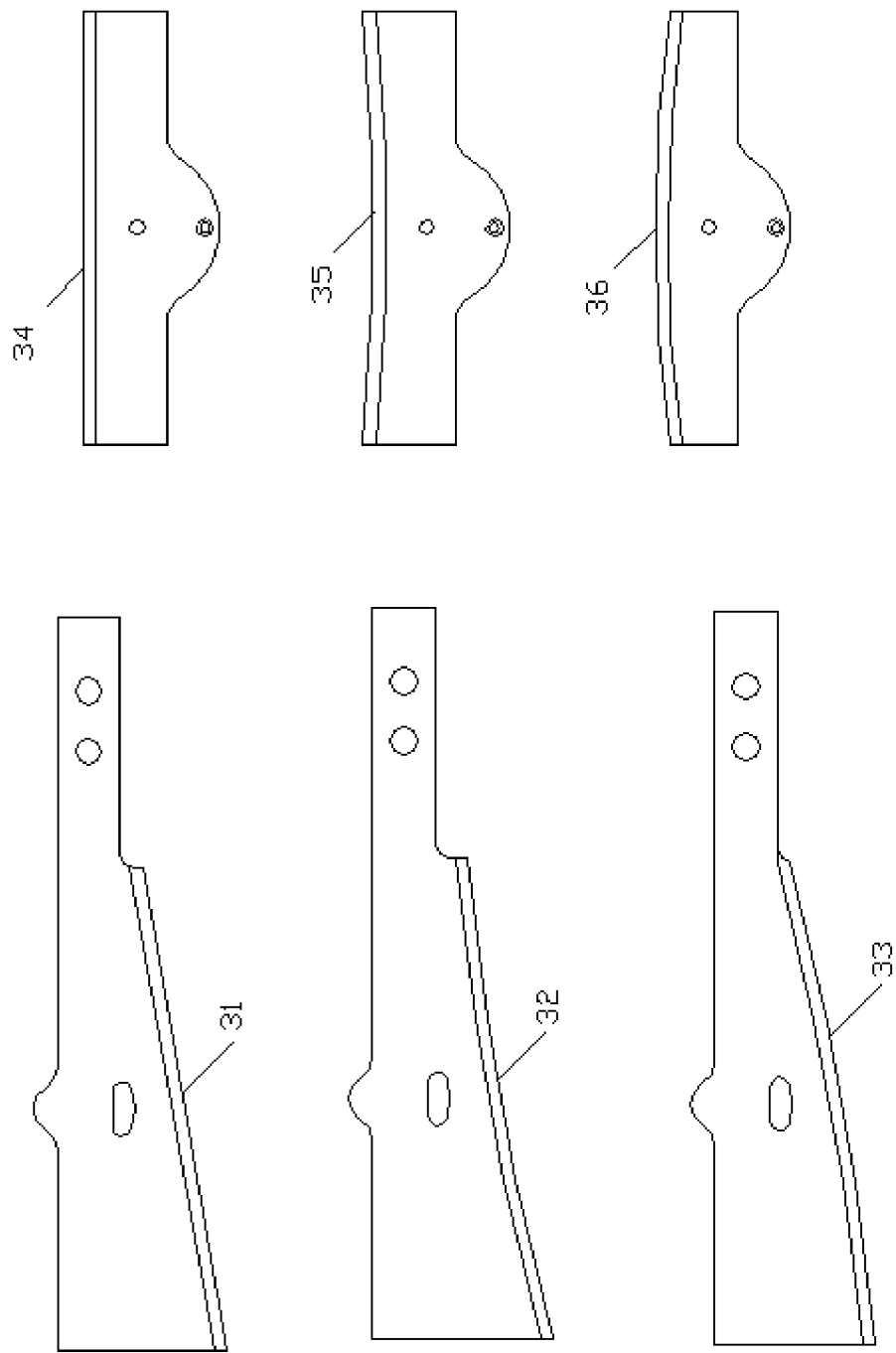
FIG. 4 shows various shapes of the blade curves for the big tunable mask.

Some typical shapes of the blade for the lower and upper pieces are shown in FIG. 4. A group of straight 31, concave 32, and convex 33 blades can be used for the lower piece. Right next to the lower pieces shown in the figure, these three types of shapes (34, 35, and 36) are also applied to the blade of the upper piece.

Figure 5A:
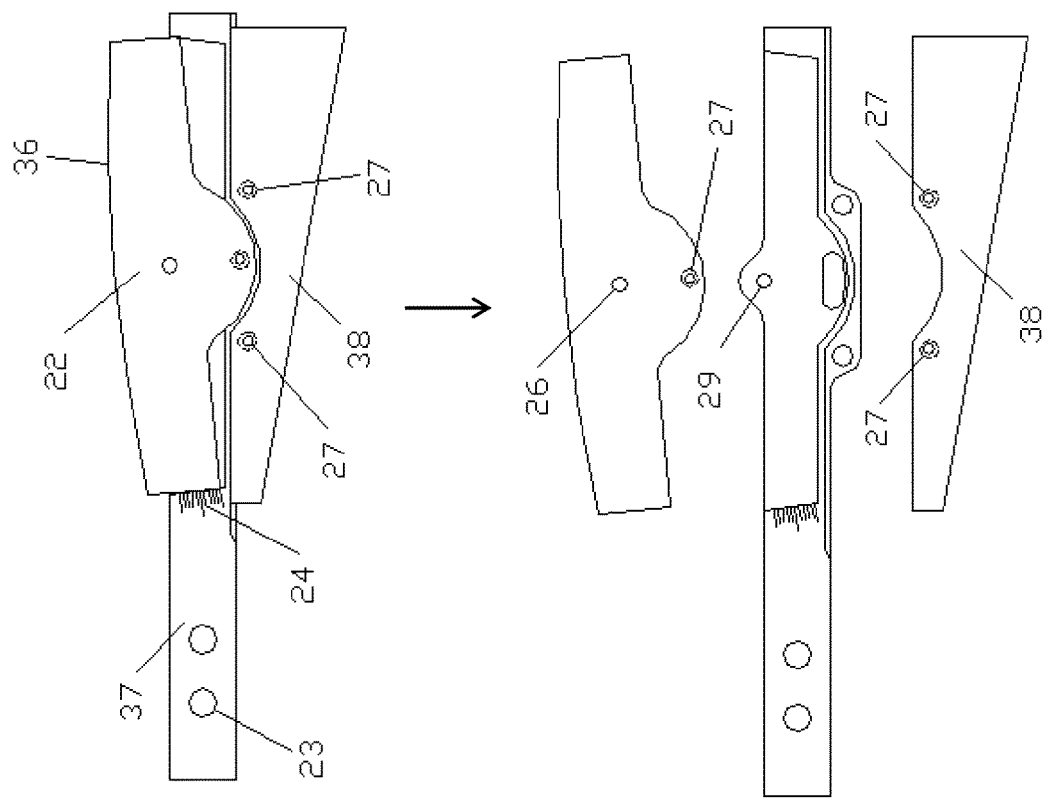
FIG. 5(a) shows the topside of the three piece tunable mask.
Figure 5B:
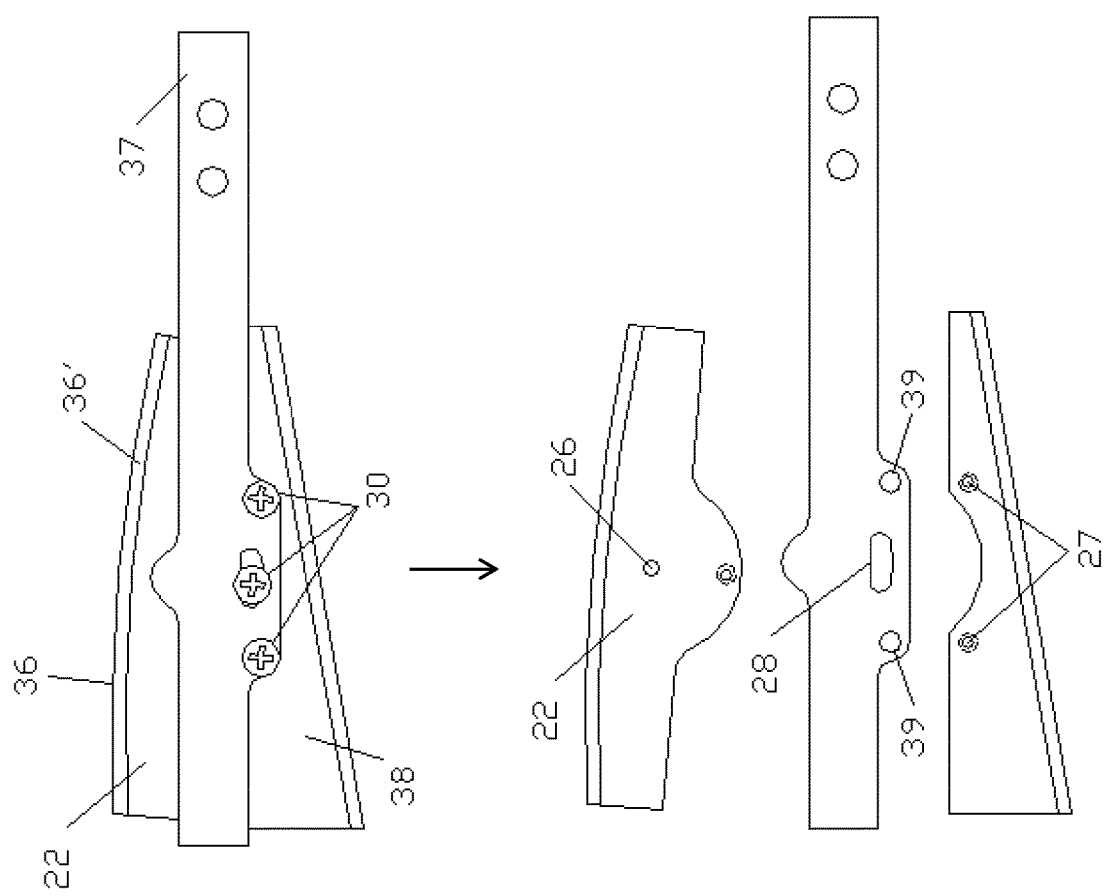
FIG. 5(b) shows the underside of three piece tunable mask.

Now it turns to the third preferred embodiment of this invention. Both the topside and underside of Example 3, which is called three piece tunable mask, are shown in FIGS. 5 (a) and (b). Example 3 has an almost identical overall shape to the big tunable mask as shown in Example 2. The upper piece of Example 3 has the same structure and affixing means to the mask body as the one of Example 2. However, the lower piece 38 is completely separated from the mask body 37 before they are assembled together. It has two threaded holes and is affixed to the mask body 37 by two fixing screws. Two round holes 39 are opened on the mask body 37 to accommodate the fixing screws. Because the lower piece is an independent part from the mask body, it can be disassembled and replaced by other lower pieces when other parts of the tunable mask remain the same. This provides flexibility and more shielding options for uniformity management of the coating thickness.

Figure 6:
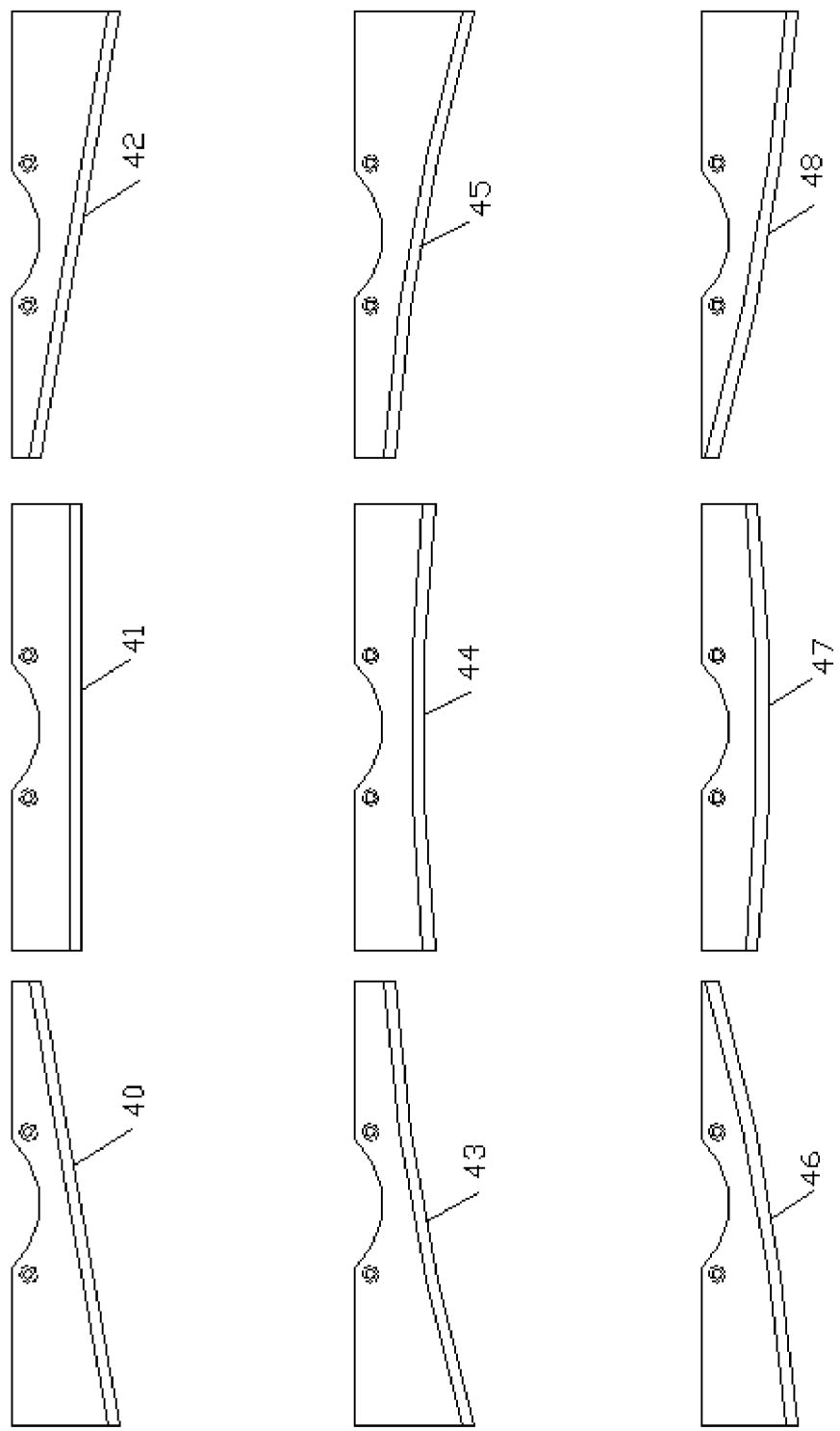
FIG. 6 shows various shapes of the blade curves for the lower piece in the three piece tunable mask.

Different shapes of the lower piece and its blade are shown in FIG. 6. Three preferred types of blades, i.e. straight line (40, 41, 42), concave curve (43, 44, 45), and convex curve (46, 47, 48), are used. Depending on the shape of the lower piece, the blade orientation can be changed and face different directions. Based on the general direction the blade faces, all lower pieces shown in FIG. 8 can be assigned in three groups, the first group of 40, 43, and 46 the second group of 41, 44, and 47, and the third group of 42, 45, and 48. The blades of the lower pieces in each group, though having different curve shapes, generally face the same direction.

Figure 7A:
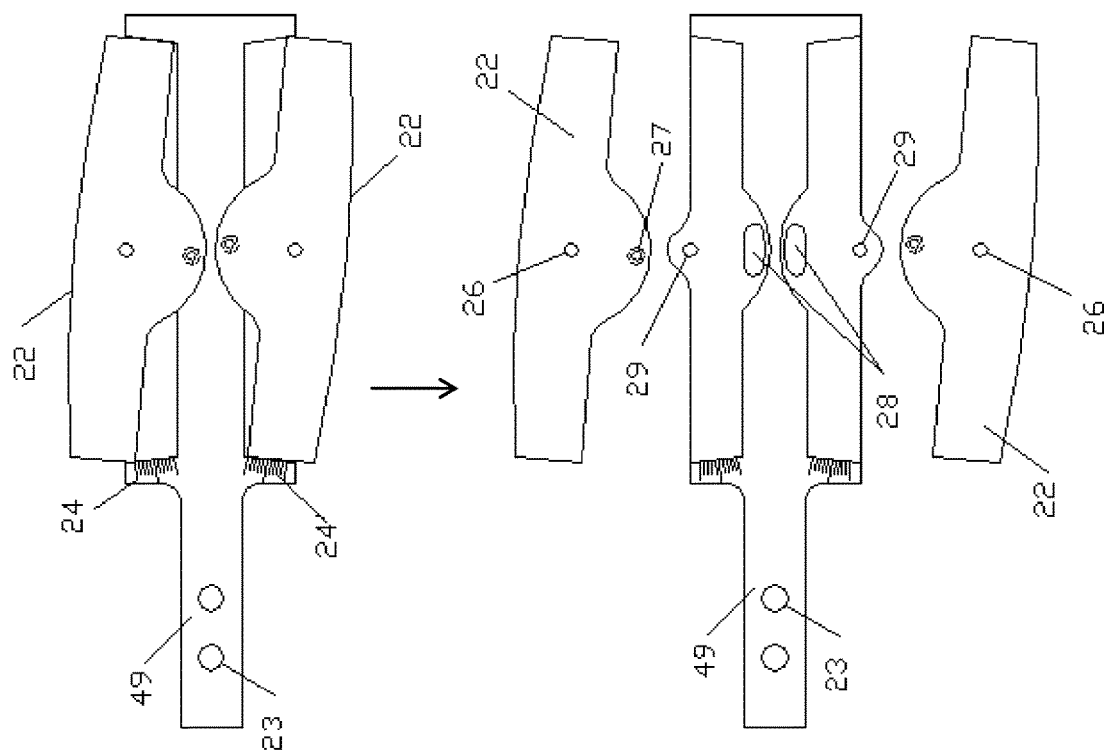
FIG. 7(a) shows the topside of the dual tunable mask.
Figure 7B:
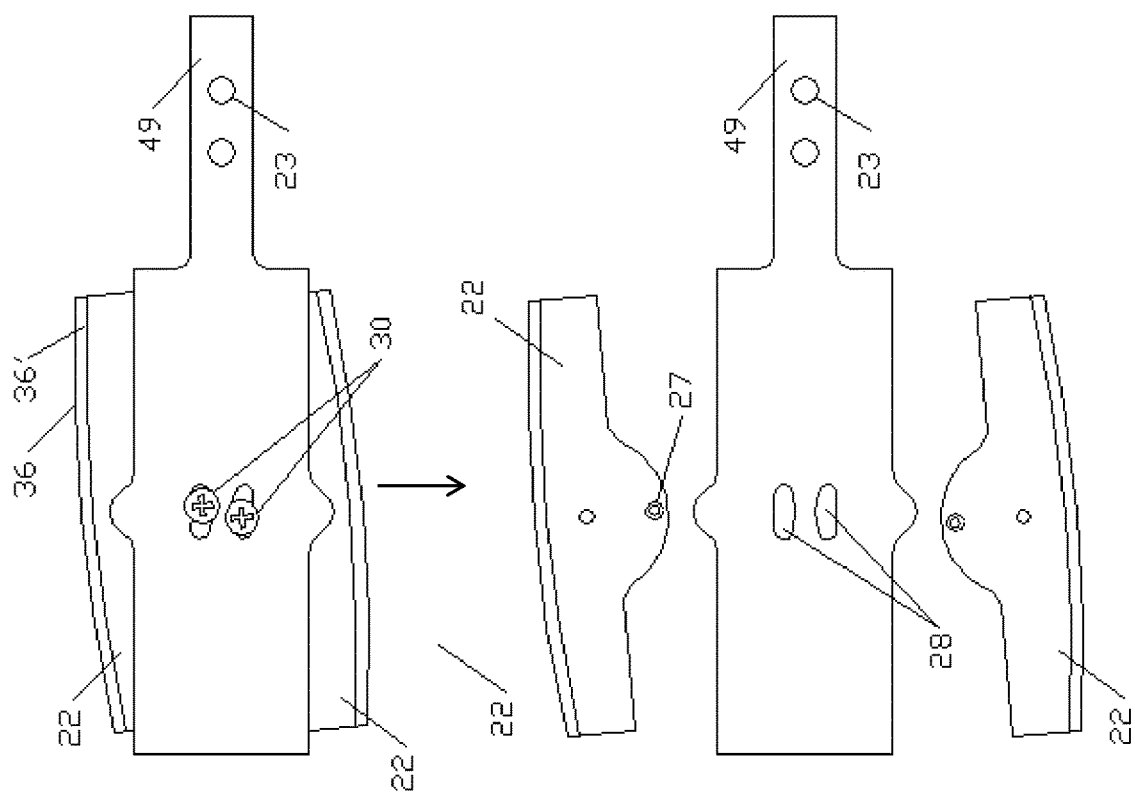
FIG. 7(b) shows the underside of the dual tunable mask.

The next preferred embodiment of the invention is Example 4, which is very similar to Example 3 except that the lower piece is tunable on the mask body instead of being unmovable like those in the previous examples. As shown in FIG. 7(a), the example has three separated pieces, the upper piece, the mask body, and the lower piece. Because both the upper and lower pieces are tunable, it is named as dual tunable mask. The mask body 49 has a mirror symmetric structure that is able to accommodate both the upper and lower pieces when they affix to the mask body. Each side of that structure consists of one kidney shaped hole, one pin, and one scale tick mark. In FIG. 7(*a*), the scale tick marks located at each side of the mask body help adjust the positions of both the upper and lower pieces on the mask body. By looking at the underside (FIG. 7(*b*)) of this dual tunable mask, it is seen that two fixing screws affix both the upper and lower pieces to the mask body 49. The blade edges of both pieces are facing the same direction. Although both the upper and lower pieces are the same in Example 4, they may have different shapes in other preferred embodiments.

What is claimed is:

1. A tunable mask for attachment to a physical vapor deposition system to manage uniformity of the coating thickness on substrate consisting essentially of a mask body with two kidney shaped holes and an asymmetrical shape along its longitudinal axis, flat and semicircular upper piece with an arcuate ridge and two threaded holes, a flat lower piece with an arcuate rail where the arcuate ridge matches exactly to the hollow space of the arcuate rail when both upper and lower pieces are put together, and two fixing screws for affixing the upper piece to the mask body through the kidney shaped holes when the fixing screws are tightened and allowing the arcuate ridge of the upper piece to move along the arcuate rail horizontally and rotate with respect to the mask body when the fixing screws releases.

2. A tunable mask as described in claim 1, wherein the upper piece has a blade with a substantially convex curve.

3. A tunable mask as described in claim 1, wherein the upper piece has a blade with a substantially concave curve.

4. A tunable mask as described in claim 1, wherein the upper piece has a blade with a straight line.

5. A tunable mask as described in claim 1, wherein the lower piece has a blade with a substantially convex curve.

6. A tunable mask as described in claim 1, wherein the lower piece has a blade with a substantially concave curve.

7. A tunable mask as described in claim 1, wherein the lower piece has a blade with a straight line.

8. A tunable mask as described in claim 1, wherein the position of the upper piece on the mask body and the pointing direction of its blade are adjustable.

9. A tunable mask as described in claim 8, wherein the lower piece is an integral part of the mask body.

* * * * *